United States Patent
Nicollini et al.

(10) Patent No.: US 10,033,352 B2
(45) Date of Patent: Jul. 24, 2018

(54) NINETY-DEGREE PHASE SHIFTER CIRCUIT AND CORRESPONDING NINETY-DEGREE PHASE-SHIFTING METHOD

(71) Applicant: STMICROELECTRONICS S.R.L., Agrate Brianza (IT)

(72) Inventors: Germano Nicollini, Piacenza (IT); Roberto Modaffari, Pallanzeno (IT); Marco Garbarino, Bareggio (IT); Federico Guanziroli, Lentate sul Seveso (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 150 days.

(21) Appl. No.: 15/053,176

(22) Filed: Feb. 25, 2016

(65) Prior Publication Data

US 2017/0019087 A1 Jan. 19, 2017

(30) Foreign Application Priority Data

Jul. 15, 2015 (IT) .................. 102015000034633

(51) Int. Cl.
*G01C 17/38* (2006.01)
*H03H 11/18* (2006.01)
(Continued)

(52) U.S. Cl.
CPC ......... *H03H 11/18* (2013.01); *G01C 19/5776* (2013.01); *G01C 25/005* (2013.01); *H03H 2210/043* (2013.01)

(58) Field of Classification Search
CPC ...... G01C 25/005; G01C 19/56; G01C 25/00; G01C 19/5776; G01P 21/00; H03H 11/18
(Continued)

(56) References Cited

U.S. PATENT DOCUMENTS 3,282,081 A * 11/1966 Boskovich ........... G01C 25/005
 327/43
5,559,687 A * 9/1996 Nicollini ................ H02M 3/07
 307/110

(Continued)

OTHER PUBLICATIONS

Antonello, R. et al., "Open loop Compensation of the Quadrature Error in MEMS Vibrating Gyroscopes,"35th Annual Conference of IEEE Industrial Electronics (ECON '09), pp. 4034-4039, Nov. 3-5, 2009.

(Continued)

*Primary Examiner* — Eric S McCall
*Assistant Examiner* — Mohammed E Keramet-Amircola
(74) *Attorney, Agent, or Firm* — Seed Intellectual Property Law Group LLP

(57) ABSTRACT

A phase shifter, which carries out a ninety-degree phase shift of a sinusoidal input signal having an input frequency, at the same input frequency, envisages: a continuous-time all-pass filter stage, which receives the sinusoidal input signal and generates an output signal phase-shifted by 90° at a phase-shift frequency that is a function of a RC time constant of the all-pass filter stage; and a calibration stage, which is coupled to the all-pass filter stage and generates a calibration signal for the all-pass filter stage, such that the phase-shift frequency is equal to the input frequency of the sinusoidal input signal, irrespective of variations of the value of the input frequency and/or of the RC time constant with respect to a nominal value.

20 Claims, 4 Drawing Sheets

(51) Int. Cl.
*G01C 19/5776* (2012.01)
*G01C 25/00* (2006.01)

(58) Field of Classification Search
USPC .............................................. 73/1.77, 503.3
See application file for complete search history.

(56) References Cited

U.S. PATENT DOCUMENTS

| | | | | |
|---|---|---|---|---|
| 2003/0033850 | A1* | 2/2003 | Challoner | G01C 19/56 73/1.77 |
| 2006/0123908 | A1* | 6/2006 | Ito | G01C 19/56 73/514.32 |
| 2008/0221823 | A1 | 9/2008 | Confalonieri et al. | |
| 2009/0051401 | A1* | 2/2009 | Confalonieri | H03H 1/02 327/306 |
| 2011/0066395 | A1* | 3/2011 | Judd | G01C 19/56 702/104 |
| 2012/0272711 | A1* | 11/2012 | Supino | G01C 19/5776 73/1.38 |
| 2013/0031948 | A1* | 2/2013 | Lignon | G01C 19/56 73/1.38 |
| 2013/0031950 | A1* | 2/2013 | Donadel | G01C 19/5776 73/1.77 |
| 2013/0125614 | A1* | 5/2013 | Casinovi | G01C 19/5776 73/1.77 |
| 2013/0133397 | A1* | 5/2013 | Kim | G01C 25/00 73/1.77 |
| 2013/0233048 | A1* | 9/2013 | Anac | G01C 25/005 73/1.77 |
| 2013/0308795 | A1* | 11/2013 | Barbieri | H03H 5/12 381/120 |
| 2015/0033821 | A1* | 2/2015 | Mangano | G01C 25/005 73/1.77 |
| 2015/0035591 | A1* | 2/2015 | Nicollini | G05F 1/56 327/543 |
| 2015/0114082 | A1* | 4/2015 | Blanchard | G01C 25/005 73/1.77 |
| 2015/0226578 | A1* | 8/2015 | Cook | G01C 19/5776 73/1.77 |
| 2015/0285658 | A1* | 10/2015 | Zotov | G01C 25/00 73/1.77 |
| 2015/0354981 | A1* | 12/2015 | Walther | G01C 19/5726 73/1.77 |
| 2016/0018243 | A1* | 1/2016 | Okon | G01C 25/00 73/1.77 |
| 2016/0029129 | A1* | 1/2016 | Nicollini | H04R 19/04 381/113 |
| 2016/0091339 | A1* | 3/2016 | Weinberg | G01C 25/00 73/1.77 |

OTHER PUBLICATIONS

Tomaz Solc, "Avian's Blog: Balanced Variable Phase Shift Circuit," 3 pages, May 13, 2014, https://www.tablix.org/avian/blog/archives/2014/05/balanced_variable_phase_shift_circuit/, retrieved Mar. 21, 2016.

* cited by examiner

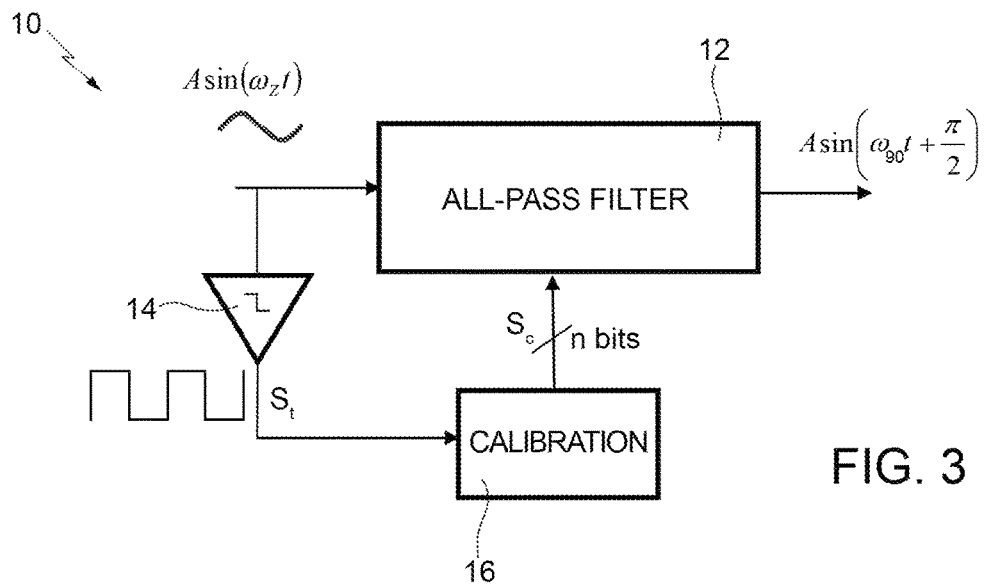
FIG. 3
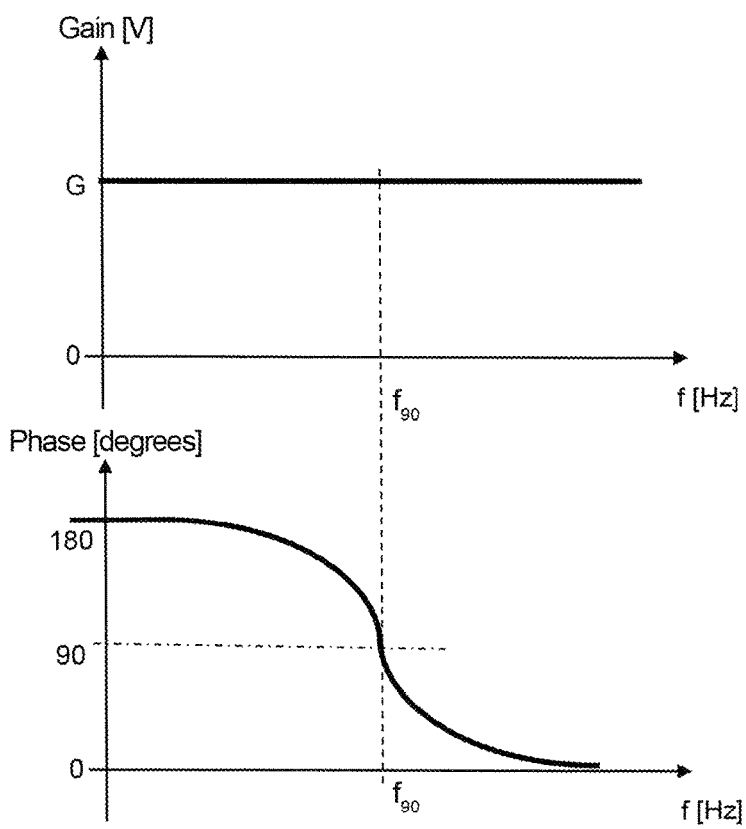
FIG. 4A
FIG. 4B

NINETY-DEGREE PHASE SHIFTER CIRCUIT AND CORRESPONDING NINETY-DEGREE PHASE-SHIFTING METHOD

BACKGROUND

Technical Field

The present disclosure relates to a phase-shifter circuit, or phase shifter, and to a corresponding method, for providing a ninety-degree ($\pi/2$) phase shift.

Description of the Related Art

There are several applications that rely on a ninety-degree phase shift of an input signal at a particular frequency value.

For instance, it is known that in MEMS (Micro-Electro-Mechanical Systems) gyroscopes a ninety-degree phase shift is used for carrying out open-loop cancelling of the so-called residual quadrature error. In this case, starting from a sinusoidal input signal at a given input frequency $f_z$, generated within the gyroscope (the so-called "driver signal"), an output signal is to be obtained with a phase shift of 90° with respect to the input signal.

In a known way, the quadrature signal is proportional to the driving movement of the micromechanical sensing structure, differently from the angular-velocity sensing signal, which is, instead, proportional to the sensing movement (being a function of the Coriolis force). The quadrature signal may have an amplitude even considerably larger than the sensing signal and consequently is to be removed. The phase shift between the sensing signal and the quadrature signal is 90° (given that the two movements are mutually orthogonal). Consequently, the quadrature signal can be effectively removed using a phase-sensitive cancelling. Since even small phase errors can generate significant errors in cancelling the quadrature signal, it is important to obtain a high-precision ninety-degree phase shift.

For further details, reference may be made, for example, to the paper: "Open loop compensation of the quadrature error in MEMS vibrating gyroscopes", R. Antonello, R. Oboe, L. Prandi, C. Caminada, and F. Biganzoli, IECON '09, 35th Annual Conference of Industrial Electronics, 2009.

It may moreover be important to maintain the ninety-degree phase shift also in the case where the value of the input frequency $f_z$ differs from the design value, for example due to a change in environmental conditions (with respect to temperature, pressure, mechanical stresses, or other factors) and/or due to variations in the manufacturing process.

Once again, this applies to the case of MEMS gyroscopes, where the input frequency $f_z$ of the aforesaid sinusoidal input signal may undergo variations, for example due to a change of the supply voltage value, the environmental conditions, or the manufacturing process.

As illustrated in FIG. 1, it may thus be important to maintain an exact 90° phase shift as the value of input frequency $f_z$ varies with respect to a nominal or typical value $f_{z\_typ}$, between a minimum value $f_{z\_min}$ and a maximum value $f_{z\_max}$.

Known solutions for obtaining such a phase shift generally envisage use of a phase-locked loop (PLL), which is designed to lock to the input frequency $f_z$ of the sinusoidal input signal and generate an appropriate clock signal with a frequency $f_{ck}$ that follows the aforesaid input frequency $f_z$, as well as one or more switched-capacitor filtering stages with a cutoff frequency determined by the same clock signal.

By way of example, FIG. 2a illustrates a phase-shifter circuit of a known type, designated as a whole by 1.

The phase-shifter circuit 1 comprises a first lowpass-filtering stage 2 and a second lowpass-filtering stage 4, which are cascaded to one another and receive a sinusoidal signal with input frequency $f_z$: $A \cdot \sin(\omega_z t)$. In particular, both the first lowpass-filtering stage 2 and the second lowpass-filtering stage 4 are of the switched-capacitor (SC) type.

The phase-shifter circuit 1 further comprises a PLL stage 5, which receives the sinusoidal signal at its input and generates a clock signal synchronous with the same sinusoidal signal at a clock frequency $f_{ck}$ locked to the input frequency $f_z$, for example equal to N times the input frequency $f_z$: $f_{ck} = N \cdot f_z$.

Given that the phase shift of each lowpass-filtering stage 2, 4 is equal to 45° ($\pi/4$) with respect to the corresponding cutoff frequency, it is sufficient for this cutoff frequency to be equal to the input frequency $f_z$ to obtain at the output a ninety-degree phase shift.

In a switched-capacitor filtering stage, the cutoff frequency can be set precisely in so far as it depends only on the clock frequency $f_{ck}$ that regulates switching and on an internal capacitive ratio.

In particular, if the input frequency $f_z$ varies on account, for example, of the change of the environmental conditions, also the clock frequency $f_{ck}$, and consequently the cutoff frequency of the lowpass filtering stages 2, 4, varies accordingly, so that this solution is able to accurately follow the possible variations of the input frequency $f_z$.

FIG. 2b shows a further known solution of a phase-shifter circuit, once again designated by 1, which differs from the solution described with reference to FIG. 2a in that it comprises a single bandpass-filtering stage 8, once again of the switched-capacitor type.

Also in this case, the PLL stage 5 generates the clock frequency $f_{ck}$ locked to the input frequency $f_z$ in such a way that the central frequency of the bandpass-filtering stage 8 is equal to the input frequency $f_z$, at which the ninety-degree phase shift is obtained.

Both described solutions, albeit enabling a ninety-degree phase shift to be obtained, in a way independent of possible variations of the input frequency $f_z$, have the drawback of involving a considerable occupation of area and a considerable electric-power consumption, in particular on account of the presence of the PLL stage 5 and of two operational amplifiers (to obtain the lowpass filtering stages 2, 4 or the bandpass-filtering stage 8).

The above known solutions may hence not be usable in cases where a reduction in the energy consumption and the occupation of area are considerations (for example, in portable applications, such as in smartphones, tablets, or wearable electronic devices, e.g., smart-watches).

BRIEF SUMMARY

The present disclosure overcomes the problems of the known solutions and in particular provides a solution for obtaining a ninety-degree phase shift of an input signal with limited expenditure in terms of circuit resources and limited energy consumption.

Consequently, according to the present disclosure a phase-shifter circuit and a corresponding phase-shifting method are provided.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein:

FIG. 3 shows a general block diagram of a ninety-degree phase-shifter circuit according to one embodiment of the present disclosure;

FIGS. 4a and 4b show plots of electrical quantities associated to the ninety-degree phase-shifter circuit of FIG. 3;

DETAILED DESCRIPTION

As illustrated in FIG. 3, according to one embodiment, a ninety-degree phase-shifter circuit, of an analog type, designated as a whole by 10, comprises:

a continuous-time all-pass filter stage 12 (i.e., one without switching elements driven by a clock signal), which receives the sinusoidal input signal $A \cdot \sin(\omega_z t)$ at the input frequency $f_z$ and is configured to supply a sinusoidal output signal, phase-shifted by 90°, at a phase-shift frequency $f_{90}$: $A \cdot \sin(\omega_{90} t + \pi/2)$;

a comparator stage 14, which receives the sinusoidal input signal $A \cdot \sin(\omega_z t)$ and generates a square-wave timing signal $S_t$ with a frequency equal to the input frequency $f_z$; and a calibration stage 16, which receives the timing signal $S_t$ from the comparator stage 14 and is configured to generate, based on the timing signal $S_t$, a calibration signal $S_c$ for the all-pass filter stage 12, such that the phase-shift frequency $f_{90}$ is equal to the input frequency $f_z$ and follows any possible variations of the same input frequency $f_z$.

In one embodiment, the calibration signal $S_c$ is a n-bit digital signal.

In particular, as discussed in detail hereinafter, the all-pass filter stage 12 has a RC time constant, on the basis of which it determines the phase-shift frequency $f_{90}$, and the calibration stage 16 is configured to calibrate the value of the RC time constant, appropriately on the basis of the input frequency $f_z$.

As illustrated in FIG. 4a, the all-pass filter stage 12 has a gain G that is constant in frequency (it should thus be noted that, merely by convention, the expression "filter stage" is used, even though in actual fact this stage does not carry out any actual filtering operation). As illustrated in FIG. 4b, the all-pass filter stage 12 moreover performs a ninety-degree phase shift at the phase-shift frequency $f_{90}$.

Figure 1:
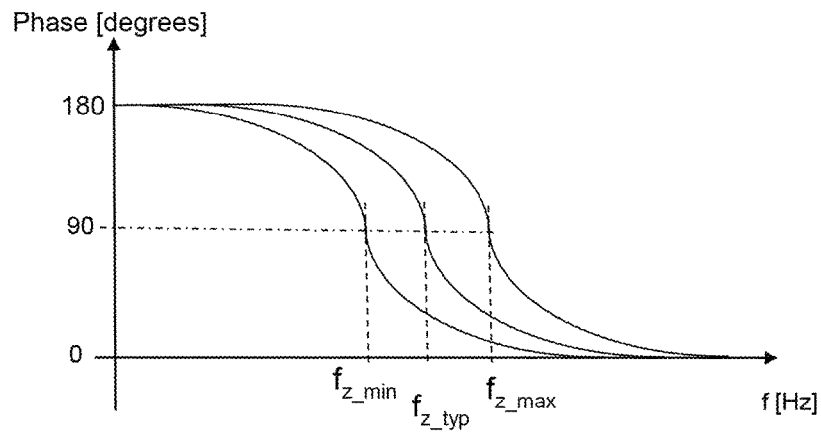
FIG. 1 is a plot showing performance of a ninety-degree phase-shifter circuit.
Figure 2A:
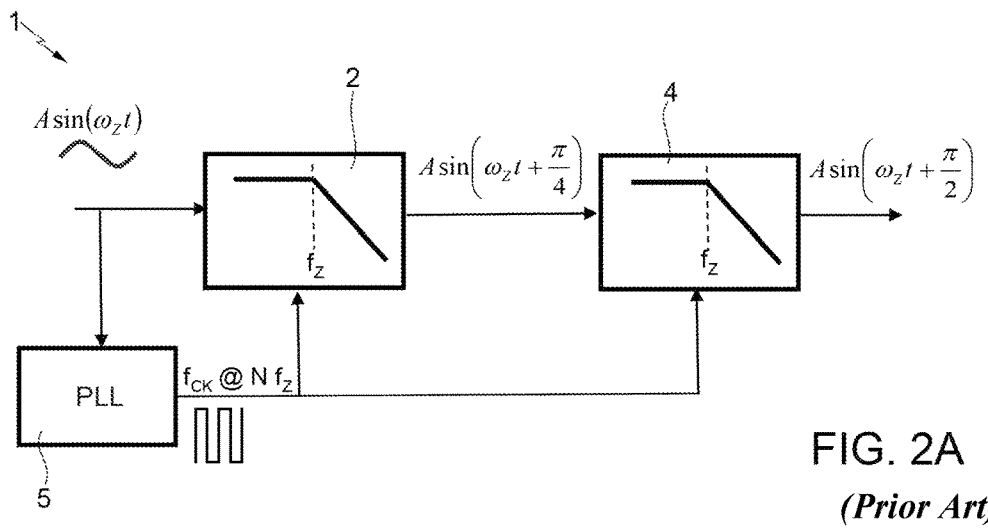
FIGS. 2a and 2b show block diagrams of different phase-shifter circuits of a known type.
Figure 2B:
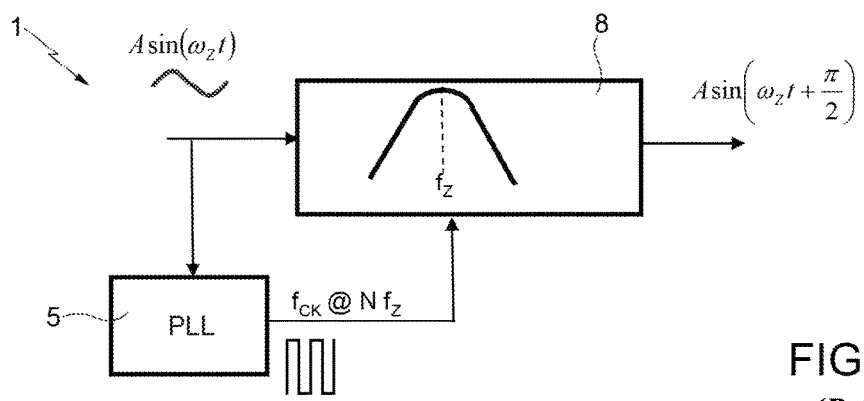
Figure 5:
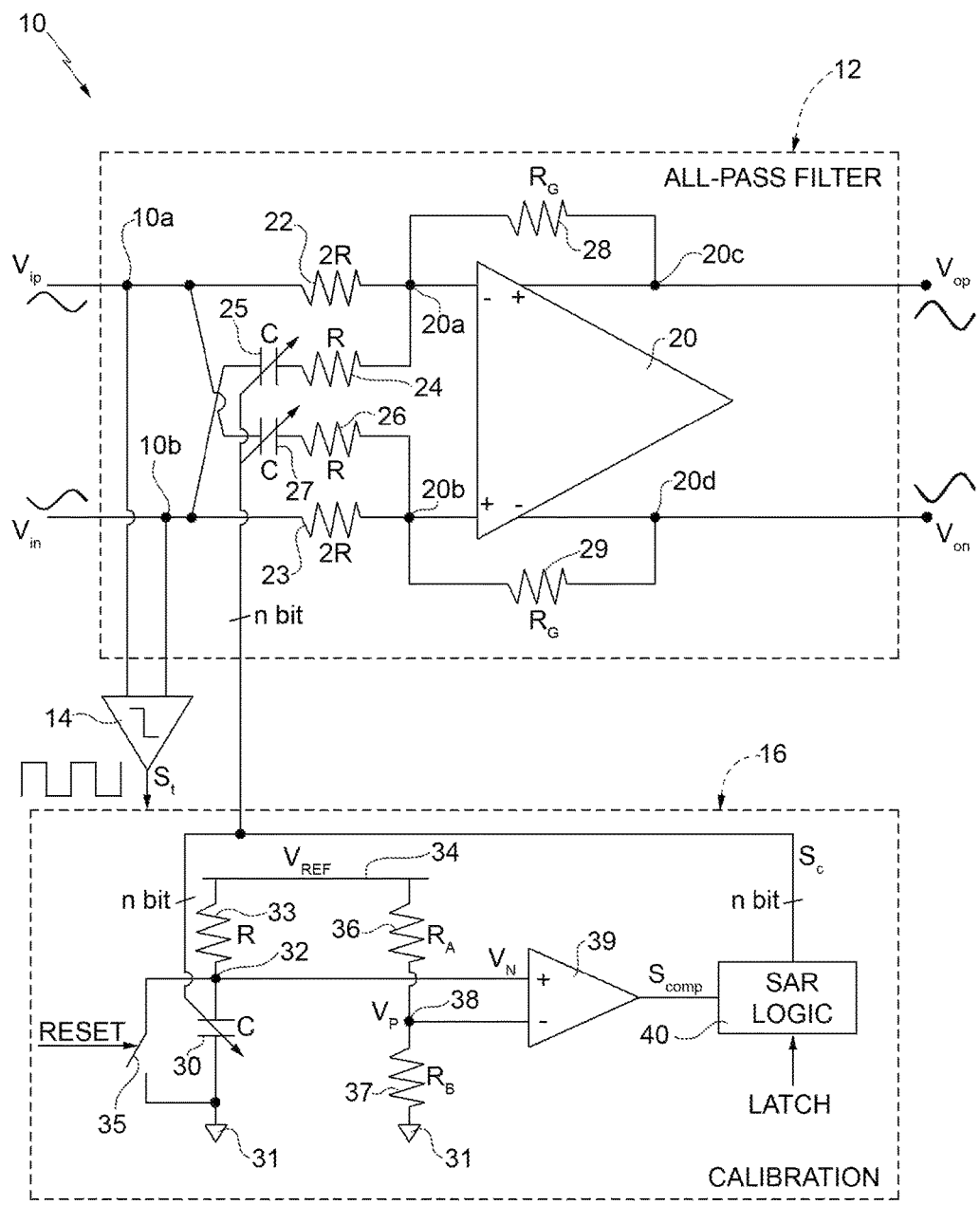
FIG. 5 shows in greater detail a circuit embodiment of the ninety-degree phase-shifter circuit of FIG. 3.

A more detailed description is now given, with reference to FIG. 5, of a possible circuit embodiment of the phase-shifter circuit 10, of a purely analog type.

The all-pass filter stage 12 comprises an operational amplifier 20 of a fully differential type, which has a first (negative) input terminal 20a and a second (positive) input terminal 20b, as well as a first (positive) output terminal 20c and a second (negative) output terminal 20d.

The first input terminal 20a is connected to a first differential input 10a of the phase-shifter circuit 10, which receives a positive sinusoidal input voltage $V_{ip}$, with an input frequency $f_z$, via a first gain resistor 22 having a resistance 2R. Likewise, the second input terminal 20b is connected to a second differential input 10b of the phase-shifter circuit 10, which receives a negative sinusoidal input voltage $V_{in}$, with an input frequency $f_z$ and a phase shift of 180° with respect to the positive sinusoidal input voltage $V_{ip}$ (i.e., $V_{in} = -V_{ip}$), via a second gain resistor 23, also having a resistance 2R.

Furthermore, the first input terminal 20a is connected to the second differential input 10b of the phase-shifter circuit 10 via the connection in series of a first resistor 24, having a resistance R, and of a first variable capacitor 25, having variable capacitance C (which may conveniently be provided via a bank of capacitors, in a known manner, not described in detail herein). Likewise, the second input terminal 20b is connected to the first differential input 10a of the phase-shifter circuit 10 via the connection in series of a second resistor 26, also having a resistance R, and of a second variable capacitor 27, also having a variable capacitance C (once again this capacitor may be provided via a bank of capacitors).

The first and second variable capacitors 25, 27 both receive the calibration signal $S_c$ generated by the calibration stage 16, which regulates the value of variable capacitance C. In the example, the calibration signal $S_c$ regulates the value of variable capacitance C with a granularity given by the number n of bits (in a known manner, not discussed in detail herein).

The all-pass filter stage 12 further comprises: a third gain resistor 28, which has a resistance $R_G$ and is connected between the first input terminal 20a and a first output terminal 20c of the operational amplifier 20, on which a positive sinusoidal output voltage $V_{op}$ is present; and a fourth gain resistor 29, which also has a resistance $R_G$ and is connected between the second input terminal 20b and a second output terminal 20d of the operational amplifier 20, on which a negative sinusoidal output voltage $V_{on}$ is present.

As highlighted previously, it is preferred for the sinusoidal output voltage $V_{op}$, $V_{on}$ to be appropriately phase-shifted by 90° with respect to the sinusoidal input voltage $V_{ip}$, $V_{in}$ at the input frequency $f_z$.

In this embodiment, the comparator stage 14 has a first input, which is connected to the first differential input 10a of the phase-shifter circuit 10 and receives the positive sinusoidal input voltage $V_{ip}$, and a second input, which is connected to the second differential input 10b of the phase-shifter circuit 10 and receives the negative sinusoidal input voltage $V_{in}$. As mentioned previously, the comparator stage 14 generates the square-wave timing signal $S_t$ with a frequency equal to the input frequency $f_z$.

The calibration stage 16 comprises: a third variable capacitor 30, which also has a variable capacitance C (that once again may be obtained via a bank of capacitors) and receives the same calibration signal $S_c$ for regulating the value of variable capacitance C; the third variable capacitor 30, which is connected between a first reference terminal 31 (for example, a terminal set at the ground voltage of the phase-shifter circuit 10) and an internal node 32, on which a first comparison voltage $V_N$ is present during operation; and a calibration resistor 33, having a resistance R and connected between the internal node 32 and a second reference terminal 34 set at a reference voltage $V_{REF}$.

According to an aspect of the present disclosure, the reference voltage $V_{REF}$ has a value that is stable and can be accurately set. For example, the reference voltage $V_{REF}$ may be generated by a band-gap voltage generator (of a known type and not illustrated herein).

The calibration stage 16 further comprises: a switch element 35, connected in parallel to the third variable capacitor 30 and controlled by a reset signal RESET; and a resistive divider, formed by a first division resistor 36, having a resistance $R_A$, and a second division resistor 37, having a resistance $R_B$, which are connected between the first and second reference terminals 31, 34 and define between them a division node 38, on which a second comparison voltage $V_P$ is present during operation.

The calibration stage 16 further comprises a comparison amplifier 39, which has a first (positive) comparison input, which is connected to the internal node 32 and receives during operation the first comparison voltage $V_N$, a second (negative) comparison input, which is connected to the division node 38 and receives the second comparison voltage $V_P$, and a comparison output, which supplies a comparison signal $S_{comp}$, having a positive or negative value according to whether the first comparison voltage $V_N$ is higher or, respectively, lower than the second comparison voltage $V_P$.

Moreover, the calibration stage 16 comprises a SAR (Successive-Approximation Register) logic module 40, which implements a successive-approximation algorithm (of a known type, not described in detail herein).

The SAR logic module 40 receives at its input the comparison signal $S_{comp}$ from the comparison amplifier 39, and also a latch signal LATCH generated, like the reset signal RESET, as a function of the timing signal $S_t$, and generates at its output the calibration signal $S_c$, as will be discussed in detail in what follows.

In a known way, not described in detail herein, the resistance and capacitance values of the circuit components referred to previously, in particular the value of resistance R and the value of capacitance C, can be appropriately matched by means of accurate control of the manufacturing process.

A more detailed discussion of the operation of the phase-shifter circuit 10 is now provided.

The transfer function of the all-pass filter stage 12 is given by the following expression:

$$A(s) = -\frac{R_g}{2R} \cdot \frac{1-sCR}{1+sCR}$$

The gain is flat and constant, irrespective of variations of the input frequency $f_z$ and/or process or temperature spreads (or variations of other parameters), given that in modulus it is equal to $R_G/2R$.

The ninety-degree phase shift is obtained at the phase-shift frequency $f_{90}$, given by $$f_{90} = \frac{1}{2\pi CR}$$

i.e., given by the time constant RC defined by the gain resistors and the variable capacitors.

The values of capacitance C and resistance R are hence chosen appropriately in such a way that the phase-shift frequency $f_{90}$ is equal to the input frequency $f_z$, in nominal design conditions.

However, the value of the phase-shift frequency $f_{90}$ may vary considerably (even by +/−30%), since the values of resistance R and capacitance C are dependent on process and temperature spreads. Furthermore, the value of the phase-shift frequency $f_{90}$ is not capable to follow the possible changes of the input frequency $f_z$.

The calibration stage 16 hence intervenes in real time, in a time-continuous manner during operation of the phase-shifter circuit 10, in order to overcome this drawback and to allow the value of the phase-shift frequency $f_{90}$ to follow precisely the value of the input frequency $f_z$, irrespective of process and temperature spreads and variations of the same input frequency $f_z$.

The calibration operation envisages successive-approximation steps, each of which starts with the reset signal RESET, which is an impulsive signal synchronized with an edge, for example a rising edge, of the timing signal $S_t$.

The reset signal RESET determines closing of the switch element 35 for a short time interval, of a duration much shorter than the period of the timing signal $S_t$, but in any case sufficient to discharge the third variable capacitor 30 and the internal node 32 at the ground voltage of the reference terminal 31 (for example, 0 V).

Next, with the switch element 35 open, the first comparison voltage $V_N$ on the internal node 32 is left free to evolve towards the reference voltage $V_{REF}$ exponentially with a RC time constant.

The comparison amplifier 39 compares the first comparison voltage $V_N$ with the second comparison voltage $V_P$, which has a value that is precise and independent of the process and temperature spreads, given that it depends on the reference voltage $V_{REF}$, which is also stable, and on a ratio of resistances according to the following expression:

$$V_p = V_{ref} \cdot \frac{R_B}{R_A + R_B}$$

The latch signal LATCH, which is also of an impulsive type, is synchronized to a subsequent edge, for example (but not necessarily) a falling edge, of the timing signal $S_t$, in such a way as to define a comparison time interval $T_c$ starting from the preceding RESET pulse, equal to a pre-set integer multiple k of the half-period $T_z/2$ of the input signal $S_t$:

$$T_C = k \cdot \frac{T_z}{2}$$

For instance, the comparison time interval $T_c$ may be equal to a half-period $T_z/2$, to one period $T_z$, or to two periods $T_z$.

In particular, the values of the resistances $R_A$, $R_B$ and of the reference voltage $V_{REF}$ are chosen in such a way that, for nominal values of the time constant RC (i.e., in the absence of process or temperature spreads, or variations of other parameters) and of the input frequency $f_z$, the first comparison voltage $V_N$ reaches the second comparison voltage $V_P$ at the end of the comparison time interval $T_c$.

The latch signal LATCH determines the instant at which the SAR logic module 40 samples the value of the comparison signal $S_{comp}$, which it receives at input from the comparison amplifier 39.

The value of the comparison signal $S_{comp}$, whether positive or negative, thus is indicative of a corresponding variation of the time constant RC and/or of the input frequency $f_z$ with respect to the nominal values, and the SAR logic module 40 regulates, with a successive-approximation algorithm (i.e., step after step), the value of the variable capacitance C by modifying the value of the calibration signal $S_c$, in such a way as to compensate this variation.

In particular, the calibration signal $S_c$ is modified to determine a decrease in the value of the variable capacitance C (with respect to the previous approximation step) in the case where the time constant RC is greater than the expected value and/or the period $T_z$ is shorter than the nominal value. Likewise, the calibration signal $S_c$ determines an increase in the value of the variable capacitance C (with respect to the previous approximation step) in the case where the time constant RC is less than the expected value and/or the period $T_z$ is longer than the nominal value.

Ideally, the successive-approximation algorithm determines reaching the expected value for the time constant RC, such that the phase-shift frequency $f_{90}$ is equal to the input frequency $f_z$ (in actual fact, this expected value is reached but for a certain margin of approximation, as will be evident to a person skilled in the field, depending on the precision of the calibration, i.e., on the number n of bits used by the SAR logic module 40).

In particular, as will be evident to a person skilled in the field, once the calibration range is known, for example +/−30% and +/−10%, respectively for process and temperature spreads (or variations of other parameters) and for variations of the input frequency $f_z$, the calibration accuracy is effectively determined only by the number n of bits used by the successive-approximation algorithm. The same number n of bits also determines the rate at which the approximation is reached during calibration.

The same algorithm hence advantageously enables calibration of the value of the RC time constant both in the presence of variations of the values of the circuit components (resistance R and capacitance C) and in the presence of variations of the value of the input frequency $f_z$ in a substantially similar way, in real time and in a time-continuous manner with respect to operation of the phase-shifter circuit 10. In other words, calibration operations are carried out "in background" with respect to the main operation of phase-shifting carried out by the all-pass filter stage 12.

In particular, the calibration signal $S_c$ determines modification of the value of variable capacitance C not only of the third variable capacitor 30 of the calibration stage 16 but also, and at the same time, of the first and second variable capacitors 25, 27 of the all-pass filter stage 12 in such a way that the all-pass filter stage 12 effectively determines the ninety-degree phase shift at the value of the input frequency $f_z$, irrespective of process and/or temperature spread and irrespective of possible variations of the value of the input frequency $f_z$ (which are in fact tracked in real time).

The advantages of the present disclosure are clear from the foregoing description.

In any case, it is once again emphasized that the phase-shifter circuit 10 has a simple construction and consequently a reduced energy consumption and reduced area occupation, thanks, for example, to the absence of any phase-locked loop and to the use of just one operational amplifier in the all-pass filter stage 12.

Furthermore, advantageously the solution described makes it possible to compensate in real time and in a time-continuous manner process and/or spread variations (or variations of other parameters), and variations of the input frequency $f_z$, ensuring that the 90° phase shift is obtained exactly at the value of the same input frequency $f_z$, irrespective of the aforesaid variations.

The gain of the phase-shifter circuit 10, determined by the all-pass filter stage 12, can be programmed as desired, without this having any impact on the value of the phase-shift frequency $f_{90}$.

As highlighted previously, the calibration operations are performed by the continuous-time calibration stage 16 in such a way as to react promptly to any possible change in the working conditions.

Figure 6:
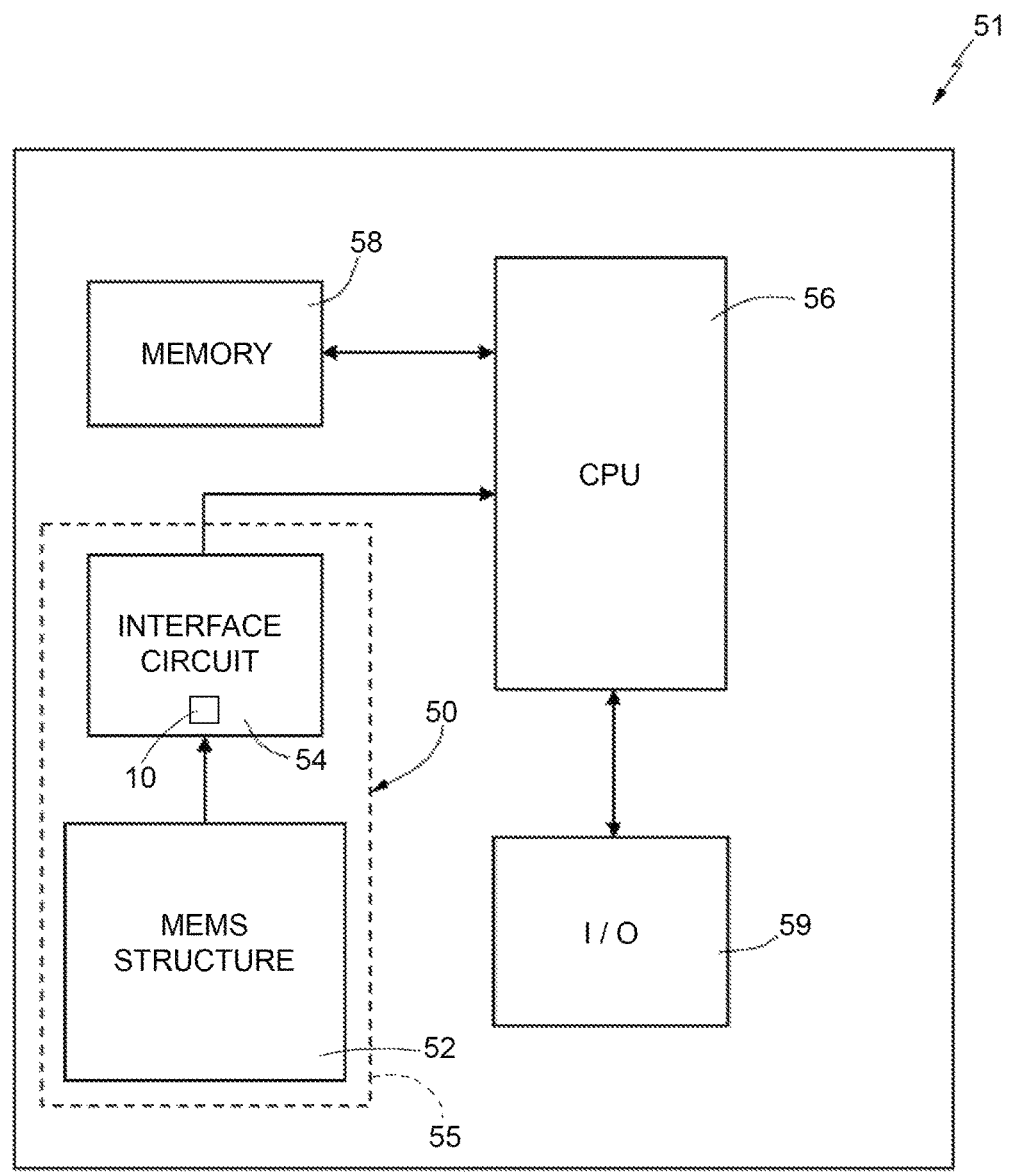
FIG. 6 is a general block diagram of an electronic device provided with a MEMS gyroscope incorporating the ninety-degree phase-shifter circuit according to a further aspect of the present disclosure.

As illustrated in FIG. 6, the phase-shifter circuit 10 is consequently particularly indicated for use in a MEMS gyroscope 50 within a portable electronic device 51, such as for example a smartphone, a tablet, or a wearable electronic device.

In a known manner (not described in detail herein), the MEMS gyroscope 50 comprises a micromechanical sensing structure 52, configured to generate an electrical quantity upon sensing of angular velocity, as well as a reading-interface circuit 54, which is coupled to the micromechanical sensing structure 52 and is configured to process the aforesaid electrical quantity and generate a sensing signal indicative of the angular velocity value.

The reading-interface circuit 54 advantageously includes the phase-shifter circuit 10, previously described in detail, operation of which enables (in a way that will be evident to a person skilled in the field) open-loop cancellation of the residual quadrature error.

The micromechanical sensing structure 52 and the reading-interface circuit 54 may be provided in distinct dice of semiconductor material and integrated within one and the same package, designated as a whole by 55.

The portable electronic device 51 further comprises: a management unit 56, a memory 58 of a nonvolatile type, and a user interface 59, including, for example, a display and appropriate data-input elements (not illustrated).

The management unit 56, which includes a microprocessor, i.e., a central processing unit (CPU), a microcontroller, or similar processing unit, manages general operation of the portable electronic device 51 and is in particular coupled to the reading-interface circuit 54 of the MEMS gyroscope 50, from which it receives the sensing signal, and to the memory 58. As a function of the sensing signal, the management unit 56 may, for example, generate appropriate actions within the user interface 59.

The phase-shifter circuit 10 can find advantageous application in all cases where generation of a ninety-degree phase shift is desirable at the frequency of an input signal, with reduced occupation of area and reduced energy consumption.

It is moreover evident that the SAR logic module 40 may use any known successive-approximation algorithm for determining, via successive approximation steps, the calibrated value of the RC time constant. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase-shifter circuit, comprising:
   a continuous-time all-pass filter stage configured to receive a sinusoidal input signal and generate an output signal phase-shifted by 90° at a phase-shift frequency that is a function of a RC time constant of said all-pass filter stage; and
   a calibration stage coupled to the all-pass filter stage and configured to generate a calibration signal for said all-pass filter stage such that the phase-shift frequency is substantially equal to an input frequency of the sinusoidal input signal.

2. The circuit according to claim 1, wherein said all-pass filter stage includes a variable capacitive element that determines said RC time constant, wherein said calibration signal is configured to vary a value of capacitance of said variable capacitive element.

3. The circuit according to claim 1, said all-pass filter stage including:
a fully differential operational amplifier having first and second differential input terminals, and first and second differential output terminals;
a first gain resistor, the first differential input terminal being coupled to a first input terminal of said phase-shifter circuit via the first gain resistor;
a first variable capacitor coupled in series with a first resistor, the first differential input terminal being coupled to a second input of said phase-shifter circuit via the first variable capacitor and first resistor;
a second gain resistor, the second differential input terminal being coupled to the second input of said phase-shifter circuit via the second gain resistor;
a second variable capacitor coupled in series with a second resistor, the second differential input terminal being coupled to the first input of said phase-shifter circuit via the second variable capacitor and second resistor;
a third gain resistor, said first differential input terminal being coupled to the first differential output terminal via the third gain resistor; and
a fourth gain resistor, said second differential input terminal being coupled to the second differential output terminal via the fourth gain resistor,
wherein said first and second variable capacitors have a substantially same value of variable capacitance and said first and second resistors have a substantially same value of resistance, said values of variable capacitance and of resistance determining said RC time constant, and wherein said first and second gain resistors have a substantially same value of resistance, substantially equal to twice the value of resistance of said first and second resistors.

4. The circuit according to claim 1, further comprising:
a comparator stage configured to receive said sinusoidal input signal and to generate a square-wave timing signal having said input frequency, wherein said calibration stage is configured to receive said timing signal and generate said calibration signal based on said timing signal.

5. The circuit according to claim 4, wherein said calibration stage includes a calibration stage RC group including a calibration stage variable capacitor and a calibration stage resistor, the calibration stage RC group defining a calibration stage time constant having a value corresponding to said RC time constant, wherein said calibration signal is configured to vary a capacitance of the calibration stage variable capacitor such that the calibration stage time constant corresponds with a period of said timing signal.

6. The circuit according to claim 5, said calibration stage including:
a switch coupled in parallel with the calibration stage variable capacitor, the switch being configured to selectively discharge the calibration stage variable capacitor in synchronization with a first edge of said timing signal;

a comparator configured to compare a charging voltage of said calibration stage variable capacitor with a comparison voltage, wherein charging of said calibration stage variable capacitor to a voltage level substantially equal to said comparison voltage occurs in a comparison time interval substantially equal to an integer multiple of a half-period of said timing signal, in a nominal condition; and
a logic module configured to receive a comparison signal generated by the comparator and to perform an evaluation of a value of said comparison signal at a second edge of said timing signal, in the nominal condition, by said comparison time interval, said logic module being further configured to generate said calibration signal as a function of said evaluation.

7. The circuit according to claim 6, wherein said logic module is configured to implement a successive approximation algorithm so as to vary with successive steps the capacitance of said calibration stage variable capacitor, via said calibration signal, until said comparison signal has an expected value at the end of said comparison time interval.

8. The circuit according to claim 6, comprising a resistive divider configured to generate said comparison voltage as a function of a reference voltage.

9. The circuit according to claim 5, wherein the calibration signal has a pre-set number of bits for varying the value of variable capacitance of the calibration stage variable capacitor of said calibration stage RC group.

10. A MEMS gyroscope, comprising:
a micromechanical sensing structure; and
a reading-interface circuit coupled to the micromechanical sensing structure, said reading-interface circuit including a phase-shifter circuit, the phase-shifter circuit including:
a continuous-time all-pass filter stage configured to receive a sinusoidal input signal and generate an output signal phase-shifted by 90° at a phase-shift frequency that is a function of a RC time constant of the all-pass filter stage; and
a calibration stage coupled to the all-pass filter stage and configured to generate a calibration signal for the all-pass filter stage such that the phase-shift frequency is substantially equal to an input frequency of the sinusoidal input signal.

11. The MEMS gyroscope according to claim 10, wherein said all-pass filter stage includes a variable capacitive element that determines said RC time constant, wherein said calibration signal is configured to vary a value of capacitance of said variable capacitive element.

12. The MEMS gyroscope according to claim 10, further comprising:
a comparator stage configured to receive said sinusoidal input signal and to generate a square-wave timing signal having said input frequency, wherein said calibration stage is configured to receive said timing signal and generate said calibration signal based on said timing signal.

13. The MEMS gyroscope according to claim 12, wherein said calibration stage includes a calibration stage RC group including a calibration stage variable capacitor and a calibration stage resistor, the calibration stage RC group defining a calibration stage time constant having a value corresponding to said RC time constant, wherein said calibration signal is configured to vary a capacitance of the calibration stage variable capacitor such that the calibration stage time constant corresponds with a period of said timing signal.

14. The MEMS gyroscope of claim 13 wherein the calibration stage further includes:
   a switch coupled in parallel with the calibration stage variable capacitor, the switch being configured to selectively discharge the calibration stage variable capacitor in synchronization with a first edge of said timing signal;
   a comparator configured to compare a charging voltage of said calibration stage variable capacitor with a comparison voltage; and
   a logic module configured to receive a comparison signal generated by the comparator and to perform an evaluation of a value of said comparison signal at a second edge of said timing signal, said logic module being further configured to generate said calibration signal as a function of said evaluation.

15. The MEMS gyroscope of claim 10 wherein the all-pass filter stage includes:
   a fully differential operational amplifier having first and second differential input terminals, and first and second differential output terminals;
   a first gain resistor, the first differential input terminal being coupled to a first input terminal of said phase-shifter circuit via the first gain resistor;
   a first variable capacitor coupled in series with a first resistor, the first differential input terminal being coupled to a second input of said phase-shifter circuit via the first variable capacitor and first resistor;
   a second gain resistor, the second differential input terminal being coupled to the second input of said phase-shifter circuit via the second gain resistor;
   a second variable capacitor coupled in series with a second resistor, the second differential input terminal being coupled to the first input of said phase-shifter circuit via the second variable capacitor and second resistor;
   a third gain resistor, said first differential input terminal being coupled to the first differential output terminal via the third gain resistor; and
   a fourth gain resistor, said second differential input terminal being coupled to the second differential output terminal via the fourth gain resistor,
   wherein said first and second variable capacitors have a substantially same value of variable capacitance and said first and second resistors have a substantially same value of resistance, said values of variable capacitance and of resistance determining said RC time constant, and wherein said first and second gain resistors have a substantially same value of resistance, substantially equal to twice the value of resistance of said first and second resistors.

16. A phase-shifting method, comprising:
   receiving, by a continuous-time all-pass filter stage, a sinusoidal input signal;
   generating, by the continuous-time all-pass filter stage, an output signal, the output signal being phase-shifted with respect to the input signal by 90° at a phase-shift frequency that is a function of a RC time constant of said all-pass filter stage; and
   generating a calibration signal for said all-pass filter stage, such that the phase-shift frequency is equal to an input frequency of the sinusoidal input signal, irrespective of variations of the value of said input frequency and/or of said RC time constant with respect to a nominal value.

17. The method according to claim 16, wherein said all-pass filter stage includes a variable capacitive element that determines said RC time constant, the method further comprising:
   varying, via said calibration signal, a capacitance of said variable capacitive element.

18. The method according to claim 16, wherein generating a calibration signal comprises:
   generating the calibration signal in a calibration stage, the calibration stage including a calibration stage RC group including a calibration stage variable capacitor and a calibration stage resistor, the calibration stage RC group defining a calibration stage time constant having a value corresponding to said RC time constant; and
   varying a capacitance of the calibration stage variable capacitor such that the calibration stage time constant corresponds with a period of said timing signal.

19. The method according to claim 18, wherein generating a calibration signal further comprises:
   discharging said calibration stage variable capacitor in synchronization with a first edge of said timing signal;
   comparing, in synchronization with a second edge of said timing signal, a charging voltage of said calibration stage variable capacitor with a comparison voltage, wherein charging of said calibration stage variable capacitor to a voltage level substantially equal to said comparison voltage occurs in a comparison time interval substantially equal to an integer multiple of a half-period of said timing signal, in a nominal condition; and
   generating said calibration signal as a function of said comparison.

20. The method according to claim 19, wherein varying a capacitance of the calibration stage variable capacitor comprises:
   performing a successive approximation algorithm to vary with successive steps the capacitance of said calibration stage variable capacitor, via said calibration signal, until said comparison signal has an expected value at the end of said comparison time interval.

* * * * *